(12) United States Patent
Murakami (10) Patent No.: US 7,907,471 B2
(45) Date of Patent: Mar. 15, 2011

(54) MEMORY CONTROL CIRCUIT AND SEMICONDUCTOR INTEGRATED CIRCUIT INCORPORATING THE SAME

(75) Inventor: Yoshihiro Murakami, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 73 days.

(21) Appl. No.: 12/539,144

(22) Filed: Aug. 11, 2009

(65) Prior Publication Data

US 2010/0039870 A1 Feb. 18, 2010

(30) Foreign Application Priority Data

Aug. 15, 2008 (JP) ................. 2008-209182

(51) Int. Cl.
*G11C 8/00* (2006.01)

(52) U.S. Cl. ............. 365/233.1; 365/193; 365/194

(58) Field of Classification Search .......... 365/233.1, 365/193–194, 189.05
See application file for complete search history.

(56) References Cited

U.S. PATENT DOCUMENTS 7,768,867 B2 * 8/2010 Nishio et al. ............... 365/233.1

FOREIGN PATENT DOCUMENTS

| JP | 2003-099321 | 4/2003 |
|---|---|---|
| JP | 2003-151271 | 5/2003 |
| JP | 2010044659(A) | 2/2010 |

* cited by examiner

*Primary Examiner* — David Lam
(74) *Attorney, Agent, or Firm* — Taft Stettinius & Hollister LLP

(57) ABSTRACT

A memory control circuit includes a clock generation circuit that generates a clock signal and provides the clock signal to an external memory device, and at least one retention circuit that retains a data signal provided from the external memory device only under a significant state of a data strobe signal, which is provided together with the data signal. The memory control circuit controls data acquisition from the retention circuit in accordance with the clock signal. A data acquisition timing judgment unit, by monitoring the clock signal, judges whether or not a timing of the data acquisition has arrived. A data strobe signal correction unit maintains the significant state of the data strobe signal until it is judged that the data acquisition timing has arrived.

8 Claims, 8 Drawing Sheets

FIRST SR LATCH 120

| S TERMINAL INPUT | R TERMINAL INPUT | OUTPUT |
|---|---|---|
| LOW | LOW | RETAINS PREVIOUS VALUE |
| HIGH | LOW | HIGH |
| LOW | HIGH | LOW |
| HIGH | HIGH | LOW (RESET PRIORITY) |

FIG. 7B

SECOND SR LATCH 121

| S TERMINAL INPUT | R TERMINAL INPUT | OUTPUT |
|---|---|---|
| LOW | LOW | RETAINS PREVIOUS VALUE |
| HIGH | LOW | HIGH |
| LOW | HIGH | LOW |
| HIGH | HIGH | LOW (SET PRIORITY) |

US 7,907,471 B2

MEMORY CONTROL CIRCUIT AND SEMICONDUCTOR INTEGRATED CIRCUIT INCORPORATING THE SAME

CROSS REFERENCE TO RELATED APPLICATIONS

This application claims priority under 35 U.S.C. §119 from Japanese Patent Application No. 2008-209182 filed on Aug. 15, 2008, the disclosure of which is incorporated by reference herein.

RELATED ART

1. Technical Field

The present disclosure relates to a memory control circuit that controls data-reading from a memory device such as an SDRAM or the like, and to a semiconductor integrated circuit incorporating the same.

2. Description of the Related Art

Memory devices known as DDR-SDRAM (Double Data Rate-Synchronous Dynamic Random Access Memory) have come to be used widely. A DDR-SDRAM has a high-speed data transfer function, referred to as a double data rate (DDR) mode. Because reading/writing of data is carried out at both rising edge times and falling edge times of a clock signal, a transfer speed twice that of a previous DRAM is realized. Memory control of a DDR-SDRAM is ordinarily implemented by data transfers to and from the memory device in accordance with a data strobe signal DQS, which is synchronized with a clock signal.

Now, in order to smoothly retain and store, which is to say latch, data from a memory device in accordance with this data strobe signal DQS, delaying of the data strobe signal DQS from the clock signal of a memory control circuit is ordinarily implemented. For example, a technology has been disclosed that controls a delay duration in accordance with cases in which the phase of a data strobe signal is advanced relative to the phase of a clock signal and cases in which the same is delayed (see FIG. 4 and FIG. 8 of Japanese Patent Application Laid-Open (JP-A) No. 2003-151271).

Furthermore, a technology has been disclosed for controlling the relevant delay duration (JP-A No. 2003-099321). In the technology that has been disclosed, Read accesses are performed while the value of a PDL (programmable delay) is being altered to adjust the timings of data-reading times from addresses of previous Writes. Thus, from whether or not the correct values are read, an optimum delay duration to specify for the PDL may be identified and Read data may be latched within an effective range. The identification and setting of this optimum delay duration is performed at memory initialization and at certain time intervals (see paragraphs 0023 to 0024 of JP-A No. 2003-099321).

However, with the technology disclosed in JP-A No. 2003-151271, a delay duration that is pre-specified at design in accordance with results of comparisons of data strobe signal phases and clock signal phases is considered. In a case of fabricating a memory control circuit as a portion of a semiconductor integrated circuit, the optimum delay duration varies because of irregularities in a wafer fabrication process, and proper data acquisition will not always be guaranteed. Furthermore, with the technology disclosed in JP-A No. 2003-099321, the identification and setting of the optimum delay duration has to be repeated at memory initialization and at certain time intervals as program operations, and the overhead is very large, which is impractical.

The present disclosure provides a memory control circuit that properly realizes data acquisition from a memory device regardless of irregularities in a fabrication process, and a semiconductor integrated circuit including the memory control circuit.

INTRODUCTION TO THE INVENTION

The present disclosure has been made in view of the above circumstances and provides a memory control circuit and a semiconductor integrated circuit incorporating the same.

The present disclosure provides a memory control circuit including: a clock generation circuit that generates a clock signal and provides the clock signal to an external memory device; at least one retention circuit that retains a data signal provided from the external memory device only under a significant state of a data strobe signal, which is provided together with the data signal; a data acquisition timing judgment unit that, by monitoring the clock signal, judges whether or not a timing of the data acquisition has arrived; and a data strobe signal correction unit that maintains the significant state of the data strobe signal until it is judged that the data acquisition timing has arrived; wherein the memory control circuit controls data acquisition from the retention circuit in accordance with the clock signal.

The present disclosure provides a semiconductor integrated circuit including a central processing unit, and a memory control circuit that controls an external memory device in accordance with control signals from the central processing unit, the memory control circuit including, for controlling data acquisition from a retention circuit in accordance with a clock signal: a clock generation circuit that generates the clock signal and provides the clock signal to the external memory device; and at least one of the retention circuit, which retains a data signal provided from the external memory device only under a significant state of a data strobe signal, which is provided together with the data signal, and the memory control circuit further including: a data acquisition timing judgment unit that, by monitoring the clock signal, judges whether or not a timing of the data acquisition has arrived; and a data strobe signal correction unit that maintains the significant state of the data strobe signal until it is judged that the data acquisition timing has arrived.

According to the memory control circuit and semiconductor integrated circuit according to the present disclosure, data acquisition from a memory device may be properly realized regardless of irregularities in a fabrication process, even in a case in which the memory control circuit is fabricated as a portion of the semiconductor integrated circuit.

BRIEF DESCRIPTION OF THE DRAWINGS

Exemplary embodiments of the present disclosure will be described in detail based on the following figures, wherein.

DETAILED DESCRIPTION

The exemplary embodiments of the present disclosure are described and illustrated below to encompass a memory control circuit that controls data-reading from a memory device such as an SDRAM or the like, and to a semiconductor integrated circuit incorporating the same, as well as fabrications methods for the foregoing. Of course, it will be apparent to those of ordinary skill in the art that the preferred embodiments discussed below are exemplary in nature and may be reconfigured without departing from the scope and spirit of the present invention. However, for clarity and precision, the exemplary embodiments as discussed below may include optional steps, methods, and features that one of ordinary skill should recognize as not being a requisite to fall within the scope of the present disclosure. It should be noted that the drawings are solely for description and are not to limit the technical scope of the present invention.

Figure 1:
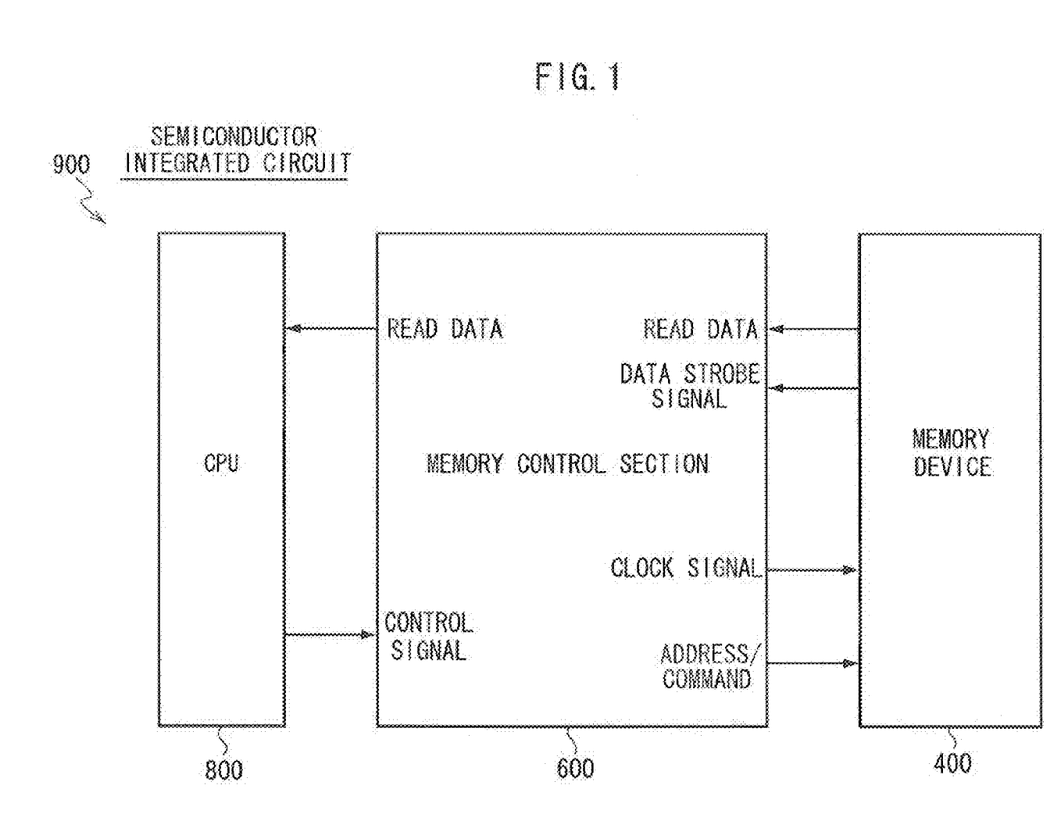
FIG. 1 is a block diagram illustrating an exemplary embodiment of the present disclosure, which illustrates overall structure including a memory control circuit according to the present disclosure.

FIG. 1 illustrates the exemplary embodiment of the present disclosure, showing overall structure including a memory control circuit according to the present disclosure. A semiconductor integrated circuit 900 is constituted with a CPU 800, a memory control circuit 600 and a memory device 400. The semiconductor integrated circuit 900 may be realized in the form of, for example, a microcomputer. The memory device 400 may be provided inside the semiconductor integrated circuit 900 as illustrated, or may be provided outside the semiconductor integrated circuit 900.

The memory device 400 is, for example, a DDR-SDRAM (Double Data Rate-Synchronous Dynamic Random Access Memory) type of memory. To briefly describe operations thereof: the CPU 800 instructs the memory control circuit 600 to read data memorized in the memory device 400, by inputting a control signal to the memory control circuit 600; and the memory control circuit 600 issues addresses/commands to the memory device 400 in accordance with this control signal, and controls reading. The memory control circuit 600 continuously provides a clock signal via the memory device 400, enabling synchronization between the two. In the particular case in which the memory device 400 is a DDR-SDRAM-type memory device, data transfers are conducted at both rising edges and falling edges of the clock signal.

In accordance with the contents of the addresses/commands from the memory control circuit 600, the memory device 400 reads memorized data and outputs the data to the memory control circuit 600 as Read data. The memory device 400 also outputs a data strobe signal, which is synchronized with output of the Read data, to the memory control circuit 600. The memory control circuit 600 retains the Read data in accordance with significant states (High and Low states) of the data strobe signal. The memory control circuit 600 latches the retained data and outputs the data to the CPU 800 in accordance with the clock signal. Accordingly, if the data strobe signal enters an undefined state, retention of the data is not guaranteed.

Although not described for the present exemplary embodiment, the CPU 800 may also memorize data in the memory device 400, by inputting a control signal for writing to the memory control circuit 600.

Figure 2:
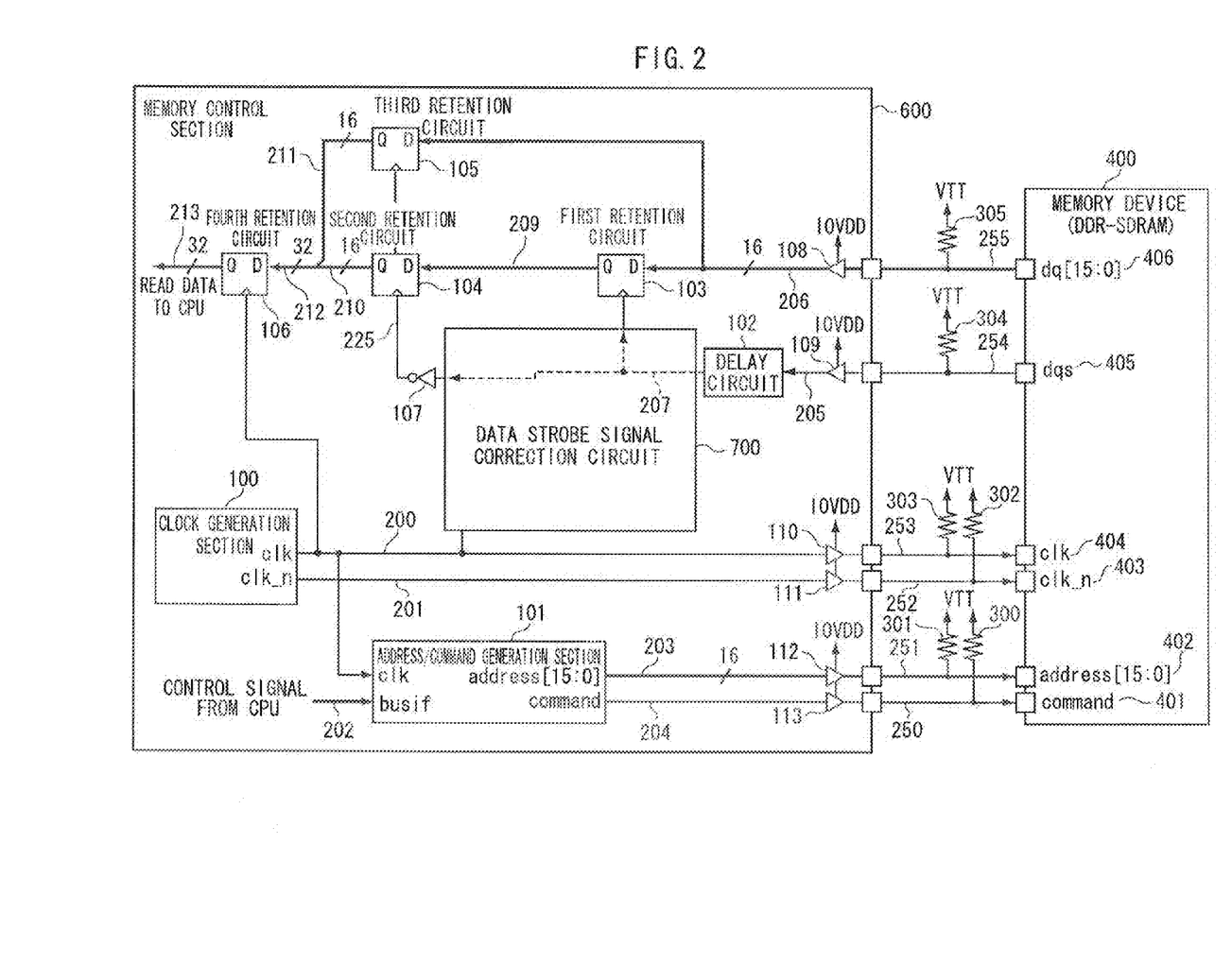
FIG. 2 is a block diagram illustrating detailed structure of the memory control circuit and a memory device illustrated in FIG. 1.

FIG. 2 shows detailed structure of the memory control circuit 600 and memory device 400 shown in FIG. 1. The memory control circuit 600 is provided with a clock generation section 100, an address/command generation section 101, plural retention circuits 103, 104, 105 and 106, a delay circuit 102, a data strobe signal correction circuit 700, plural input buffers 108 and 109, plural output buffers 110, 111, 112 and 113, and an inverter circuit 107.

The clock generation section 100 generates a normal phase clock clk 200. The normal phase clock clk 200 is inputted to a clock terminal of the fourth retention circuit 106, a clk terminal of the address/command generation section 101 and the like, and is used as an internal system clock in the memory control circuit 600. Further, the normal phase clock clk 200 is outputted (253) to the exterior via the output buffer 10 and pulled up to a potential VTT via a terminating resistance 303, and is inputted to a clk terminal of the memory device 400 and used as a normal phase clock in the memory device 400. The potential VTT is maintained at a voltage of half of a power supply IOVDD for the input buffers 108 and 109 and the output buffers 110, 111, 112 and 113.

The clock generation section 100 also generates a reversed phase clock clk_n 201. The generated reversed phase clock clk_n 201 is outputted (252) to the exterior through the output buffer 111 and pulled up to the potential VTT via a terminating resistance 302, and is inputted to a clk_n terminal of the memory device 400 and used as a reversed phase clock in the memory device 400.

The address/command generation section 101 receives a control signal 202 from the CPU (see FIG. 1), and generates a 16-bit address signal, address[15:0] 203, and a command signal, command 204, which are synchronized with the normal phase clock clk 200. The generated 16-bit address signal address[15:0] 203 is outputted (251) to the exterior through the output buffer 112 and pulled up to the potential VTT via a terminating resistance 301, and is inputted to an address[15:0] terminal 402 of the memory device 400 and used as an address signal in the memory device 400. Meanwhile, the generated command signal command 204 is outputted (250) to the exterior through the output buffer 113 and pulled up to the potential VTT via a terminating resistance 300, and is inputted to a command terminal 401 of the memory device 400 and used as a command signal in the memory device 400.

The memory device 400 receives the normal phase clock 253, reversed phase clock 252, address signal 251 and command signal 250 that are outputted from the memory control circuit 600 and operates, select data memorized in the memory device 400, and output this data as a 16-bit Read data signal dq[15:0] 255. The memory device 400 also outputs a data strobe signal dqs 254, which is synchronized with the 16-bit Read data signal dq[15:0] 255. The 16-bit Read data signal dq[15:0] 255 is pulled up to the potential VTT via a terminating resistance 305 and is inputted to the memory control circuit 600. The data strobe signal dqs 254 is pulled up to the potential VTT via a terminating resistance 304 and is inputted to the memory control circuit 600. The data strobe signal dqs 254 is a clock signal for memory control circuit 600 to acquire the 16-bit Read data signal dq[15:0] 255, and is generated on the basis of a normal phase clock (clk) and a reversed phase clock (clk_n) in the memory device 400. It should be noted that the cycles of the data strobe signal dqs 254 and the cycles of the clocks (clk and clk_n) are at the same frequency, but have phase differences in accordance with their respective propagation paths.

In the memory control circuit 600, the 16-bit Read data signal dq[15:0] 255 provided from the memory device 400 is inputted (206) to the input buffer 108, and is also inputted to the first retention circuit 103 and the third retention circuit 105. A 16-bit output 209 of the first retention circuit 103 is inputted to a data terminal of the second retention circuit 104. A 16-bit output 210 of the second retention circuit 104 and a 16-bit output 211 of the third retention circuit 105 are combined by bus connection, to constitute a 32-bit signal 212. The combined 32-bit signal 212 is inputted to a data terminal of the fourth retention circuit 106. The fourth retention circuit 106 acquires the inputted 32-bit signal 212 in accordance with the normal phase clock clk 200, and outputs the same to the CPU as Read data 213.

The data strobe signal dqs 254 provided from the memory device 400 is inputted (205) to the input buffer 109, and a delay is applied (207) to this output by the delay circuit 102. A characteristic of the present disclosure is that the data strobe signal correction circuit 700 is newly provided in the memory control circuit 600. The signal 207 to which the delay has been applied would conventionally be provided to a clock terminal of the first retention circuit 103, and also inverted (225) by the inverter circuit 107 and provided to clock terminals of the second retention circuit 104 and the third retention circuit 105 (see the broken lines in FIG. 2).

Figure 3:
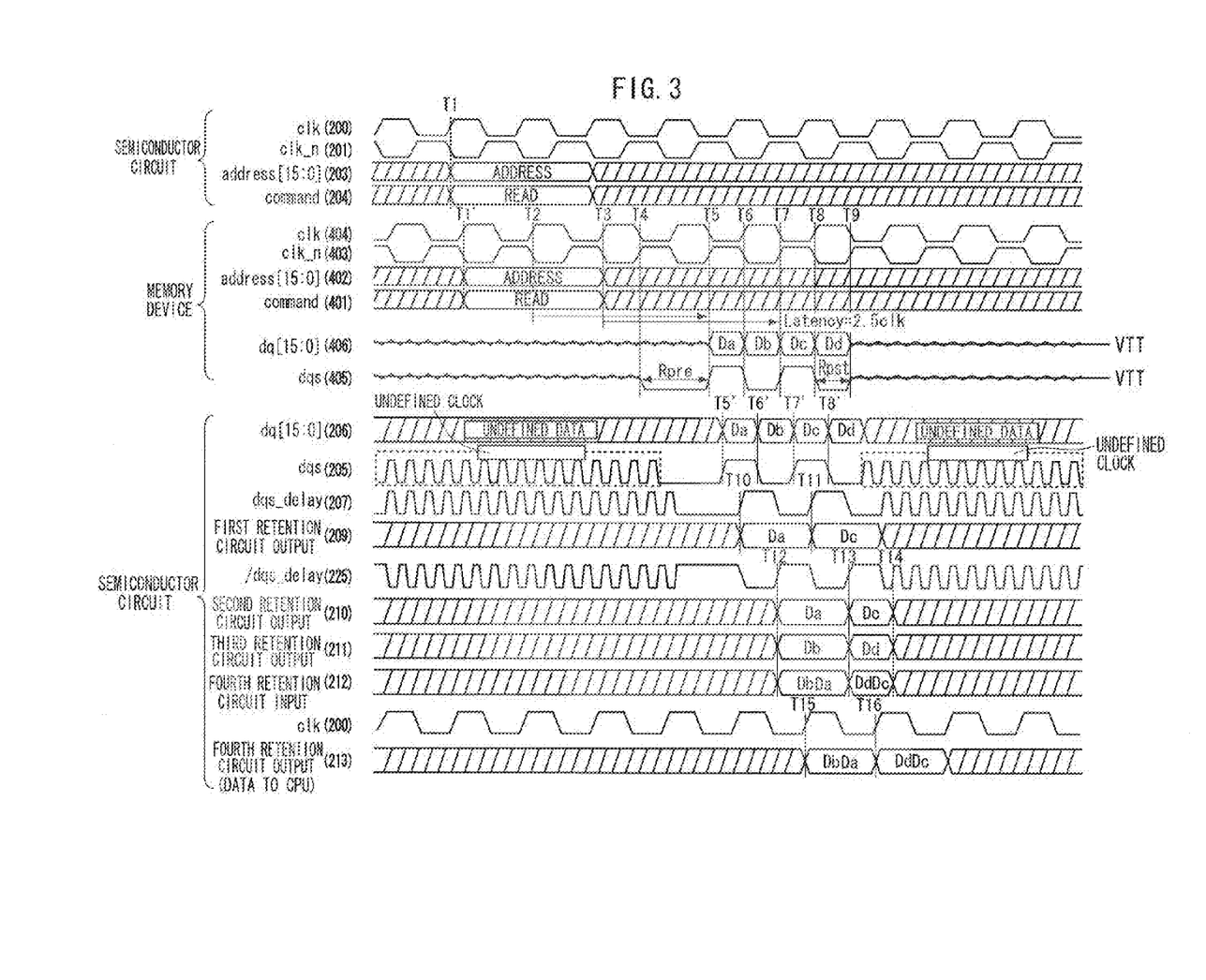
FIG. 3 is a timing chart illustrating operations that the memory control circuit performs in co-ordination with the memory device.
Figure 4:
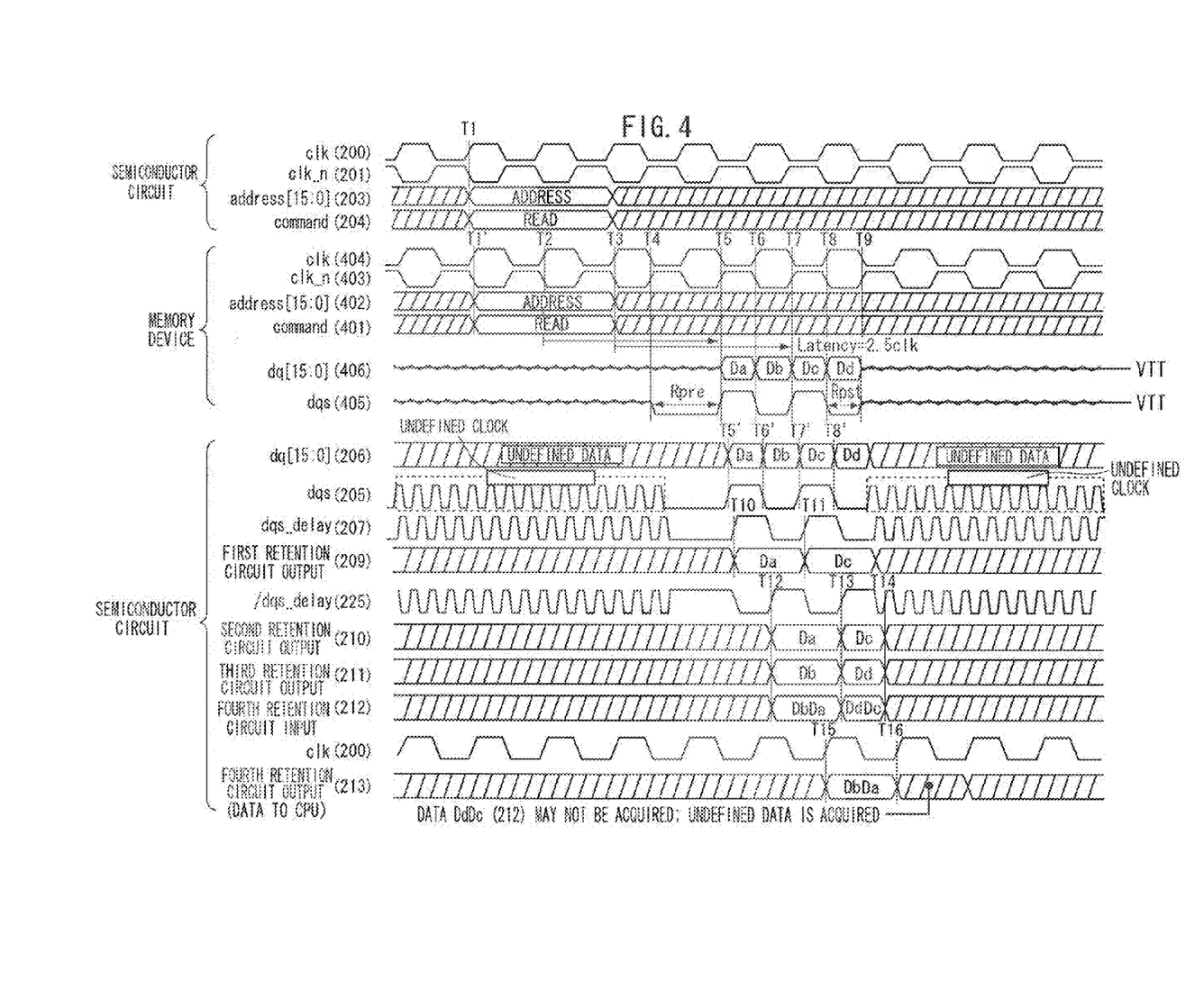
FIG. 4 is a timing chart illustrating the operations that the memory control circuit performs in co-ordination with the memory device, which particularly illustrates a state in which undefined data is stored.

FIG. 3 and FIG. 4 illustrate operations that the memory control circuit performs in co-ordination with the memory device in the form of timing charts. Here, a case is described in which the data strobe signal dqs 254 that is outputted from the memory device 400 is directly used as a clock signal in the second retention circuit 104 and the third retention circuit 105. That is, operations will firstly be described with reference to FIG. 3 and FIG. 4 without consideration of the data strobe signal correction circuit 700 that is a characteristic of the present disclosure.

Referring to FIG. 3, operations are illustrated of the memory control circuit receiving a control signal from the CPU and reading data from a memory device provided outside the memory control circuit, up to the memory control circuit sending the Read data to the CPU.

At a time T1, the address/command generation section 101 receives the control signal 202 from the CPU, and generates the 16-bit address signal address[15:0] 203 and command signal command 204 that are synchronized with the normal phase clock clk 200.

At a time T1', each of the normal phase clock clk 200, the reversed phase clock clk_n 201, the 16-bit address signal address[15:0] 203 and the command signal command 204 that are generated at the memory control circuit 600 reaches the memory device 400, having been delayed by wiring within the memory control circuit 600, wiring between the output buffers and the memory device 400 and the like.

At a time T2 and a time T3, the memory device 400 acquires the inputted address signal address[15:0] 402 and command signal command 401, at points in time at which the signal levels of a normal phase clock clk 404 and a reversed phase clock clk_n 403 cross (hereinafter referred to as cross points). Then, the memory device 400 switches into a state for outputting a 16-bit data signal dq[15:0] 406 and a data strobe signal dqs 405 in response to the inputs.

From a time T4 to a time T5, for one cycle before outputting the 16-bit data signal dq[15:0] 406 and the data strobe signal dqs 405, the memory device 400 switches into a read-preamble period (Rpre in the drawings) and sets the data strobe signal dqs 405 to Low output for this period.

At time T5 and a time T6, depending on the inputs acquired at time T2, the memory device 400 time-divides the 16-bit data signal dq[15:0] 406 into two cycles in synchronization with the cross points and outputs the same (Da and Db in FIG. 3 and FIG. 4). The memory device 400 also outputs the data strobe signal dqs 405, for acquiring these data signals.

Similarly, at a time T7 and a time T8, depending on the inputs acquired at time T3, the memory device 400 time-divides the 16-bit data signal dq[15:0] 406 into two cycles in synchronization with the cross points and outputs the same (Dc and Dd in FIG. 3 and FIG. 4). The memory device 400 also outputs the data strobe signal dqs 405 for acquiring these data signals.

From time T8 to a time T9, the memory device 400 ends output of the data strobe signal dqs 405 and switches into a half-cycle Read-postamble period (Rpst in the drawing), and sets the data strobe signal dqs 405 to Low output for this period. After the Read-postamble, the 16-bit data signal dq[15:0] 406 and the data strobe signal dqs 405 are terminated via the terminating resistances to the terminating voltage level (VTT in FIG. 3 and FIG. 4).

At a time T5', a time T6', a time T7' and a time T8', the 16-bit data signal dq[15:0] 406 and data strobe signal dqs 405 that are outputted from the memory device 400 are inputted into the memory control circuit 600, being delayed by wiring between the memory control circuit 600 and the memory device 400, and the input buffers and the like.

When the memory device 400 is not outputting signals, the 16-bit data signal dq[15:0] 406 and the data strobe signal dqs 405 are subject to slight variations from the VTT level (VTT in FIG. 3 and FIG. 4) because of the effects of external noise and the like, as is illustrated. In consequence, a 16-bit data signal dq[15:0] 206 and a data strobe signal dqs 205 that are inputted to the memory control circuit 600 are inputted as an undefined data and an undefined clock or the like, as is illustrated in the drawings, with output values of the input buffers being unsettled.

At a time T10 and a time T11, the first retention circuit 103 acquires (209) the 16-bit data signal dq[15:0] 206 inputted into the memory control circuit 600 (Da and Dc in FIG. 3 and FIG. 4), in accordance with a data strobe signal dqs_delay 207 that has been delayed by the delay circuit 102.

At a time T12 and a time T13, the second retention circuit 104 acquires (210) output (209) of the first retention circuit 103 (Da and Dc in FIG. 3 and FIG. 4) in accordance with a signal /dqs_delay 225, for which the data strobe signal dqs_delay 207 that has been delayed by the delay circuit 102 is inverted by the inverter circuit 107. The third retention circuit 105 acquires (211) the 16-bit data signal dq[15:0] 206 (Db and Dd in FIG. 3 and FIG. 4) inputted into the memory control circuit 600 in accordance with the signal /dqs_delay 225 for which the data strobe signal dqs_delay 207 delayed by the delay circuit 102 has been inverted by the inverter circuit 107. The output 210 of the second retention circuit 104 and the output 211 of the third retention circuit 105 are combined by bus connection and become an input of the fourth retention circuit 106. Thus, the 32-bit data signal 212 is generated (DbDa and DdDc in FIG. 3 and FIG. 4).

At a time T14, the second retention circuit 104 acquires the undefined data (209) that is outputted from the first retention circuit 103, in accordance with the undefined clock /dqs_delay 225 that is inputted with variations from the VTT level subsequent to the time T9. Similarly, the third retention circuit 105 acquires the undefined data (206) that is inputted to the memory control circuit 600, in accordance with the undefined clock /dqs_delay 225 that is inputted with variations from the VTT level. Therefore, the 32-bit data signal 212 that is the input of the fourth retention circuit 106 is undefined data.

At a time T15 and a time T16, the fourth retention circuit 106 acquires the 32-bit data signal 212 in accordance with the normal phase clock clk 200, and outputs the same to the CPU as the Read data 213 (DbDa and DdDc in FIG. 3 and FIG. 4).

Referring to FIG. 4, similarly to FIG. 3, operations are illustrated of the memory control circuit reading data from a memory device, up to sending the Read data to the CPU. Now, in wafer fabrication technology, a delay time is reduced by shortening of wiring lengths, improvements in transistor performance and the like. However, irregularities in finishing of wafer fabrication lead to instability of the delay time and, because of the delay duration applied to the data strobe signal, data that a retention circuit reads from the memory device may not be acquired, and undefined data is acquired. The above phenomenon will now be described.

Describing this phenomenon in more detail with reference to FIG. 4: firstly, a delay due to wiring of the memory control circuit 600, the output buffers, and wiring between the memory control circuit 600 and the memory device 400 is reduced. As a result, the difference between time T1 and time T1' is reduced. Secondly, a delay due to wiring between the memory control circuit 600 and the memory device 400 and the input buffers of the semiconductor circuit is reduced. As a result, the difference between time T5 and time T5' is reduced. The same applies to time T6, time T7 and time T8. Thirdly, a delay due to the delay circuit 102 is reduced and the delay of dqs_delay 207 is reduced. Because of these effects, at time T16, the input (212) of the fourth retention circuit 106 has already been updated to an undefined state. If an attempt is made to acquire this undefined data in accordance with the normal phase clock clk 200, undefined data is transmitted to the CPU as the Read data 213.

Data Strobe Signal Correction Circuit

If, as described above, the data strobe signal dqs 254 outputted from the memory device 400 is directly used as a clock signal of the second retention circuit 104 and the third retention circuit 105, the input (212) of the fourth retention circuit 106 is updated by the rising edge of the /dqs_delay 225 at time T14 before the rising edge of the normal phase clock clk 200 at time T16. Thus, undefined data is acquired at the fourth retention circuit 106 (see FIG. 4).

Accordingly, in order to avoid this phenomenon, the data strobe signal correction circuit 700 is provided, which performs control such that the /dqs_delay 225 rises later than the rising edge of the normal phase clock clk 200 at time T16.

Figure 5:
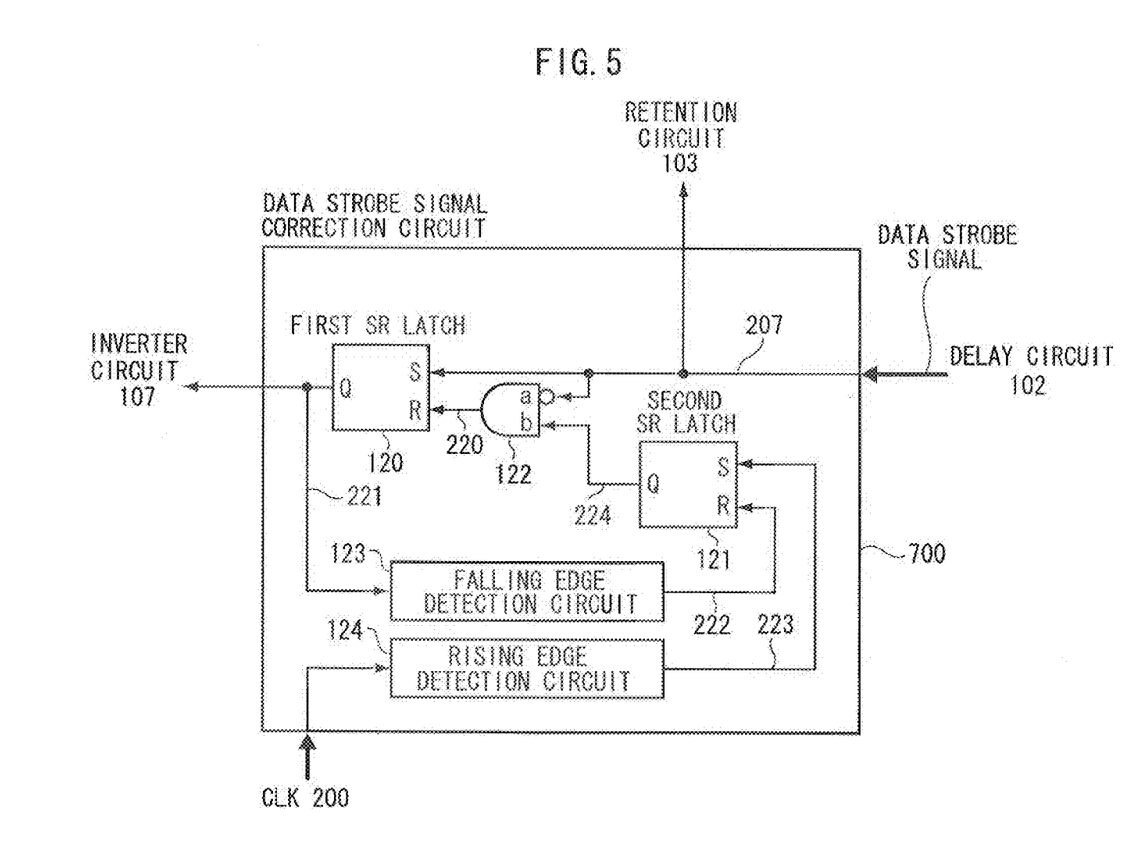
FIG. 5 is a block diagram illustrating detailed structure of a data strobe signal correction circuit.

FIG. 5 illustrates detailed structure of the data strobe signal correction circuit 700. As described above, the data strobe signal dqs 254 that is outputted from the memory device 400 is inputted (205) to the input buffer 109, delayed by the delay circuit 102, and thereafter inputted to the data strobe signal correction circuit 700.

The data strobe signal dqs 254 that is delayed and inputted (207) is inputted to a clock terminal of the first retention circuit 103, to an a terminal of an AND circuit 122 and to an S terminal of a first SR latch 120. An output 221 of the first SR latch 120 is outputted to the inverter circuit 107, and is inputted as feedback to an R terminal of the first SR latch 120. The output 221 of the first SR latch 120 is inputted to a falling edge detection circuit 123.

Figure 7A:
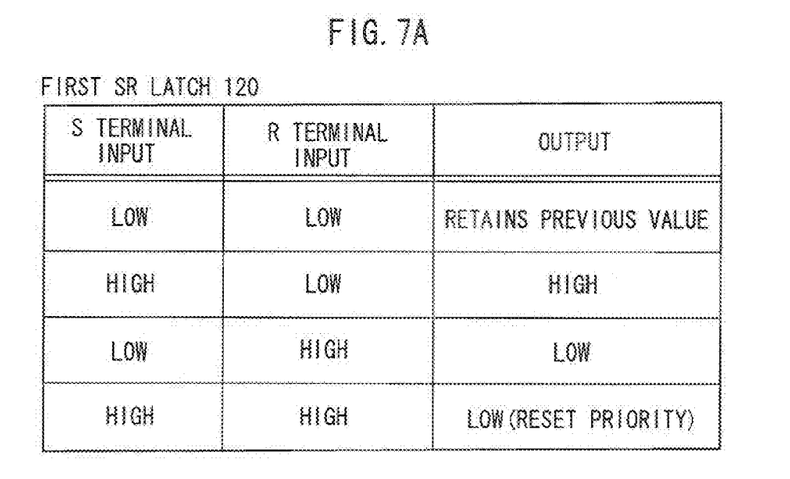
FIG. 7A is a chart illustrating latch operation transitions of a first SR latch included in the data strobe signal correction circuit.
Figure 7B:
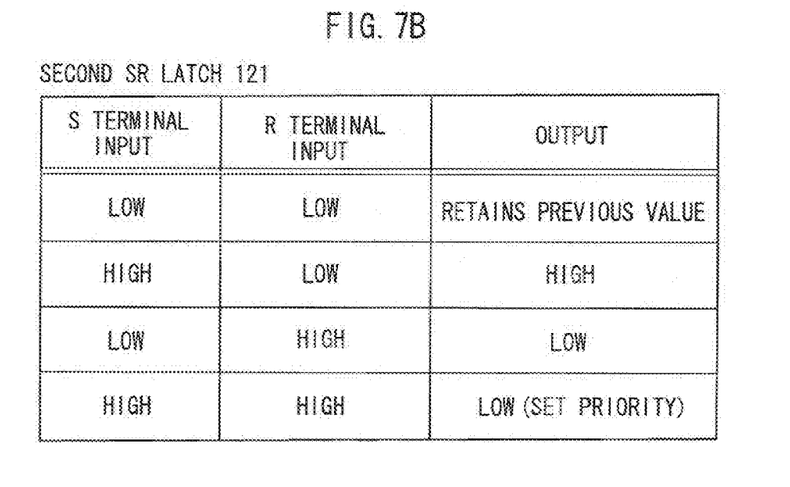
FIG. 7B is a chart illustrating latch operation transitions of a second SR latch included in the data strobe signal correction circuit.

The falling edge detection circuit 123 generates a falling edge detection pulse signal 222 in response to a falling edge of the output 221 of the first SR latch 120 that is inputted thereto. The generated falling edge detection pulse signal 222 is inputted to an R terminal of a second SR latch 121. Meanwhile, the normal phase clock clk 200 is inputted to a rising edge detection circuit 124. The rising edge detection circuit 124 monitors the signal waveform of the normal phase clock clk 200 and generates a rising edge detection pulse signal 223 in response to a rising edge thereof. The generated rising edge detection pulse signal 223 is inputted to the S terminal of the second SR latch 121. An output 224 of the second SR latch 121 is inputted to a b terminal of the AND circuit 122. The first SR latch 120 and the second SR latch 121 perform latch operations in accordance with the transition charts illustrated in FIG. 7A and FIG. 7B.

The AND circuit 122 outputs (220) a logical AND between the delayed and inputted (207) data strobe signal dqs 254 that is inputted to the a terminal and the output 224 of the second SR latch 121 that is inputted to the b terminal. The output 220 of the AND circuit 122 is inputted to the R terminal of the first SR latch 120. The output 221 of the first SR latch 120 is inputted to the inverter circuit 107 as an output of the data strobe signal correction circuit 700. The output 221 of the data strobe signal correction circuit 700 is inverted (225) by the inverter circuit 107 and thereafter inputted to the clock terminal of the second retention circuit 104 and the clock terminal of the third retention circuit 105.

Figure 6A:
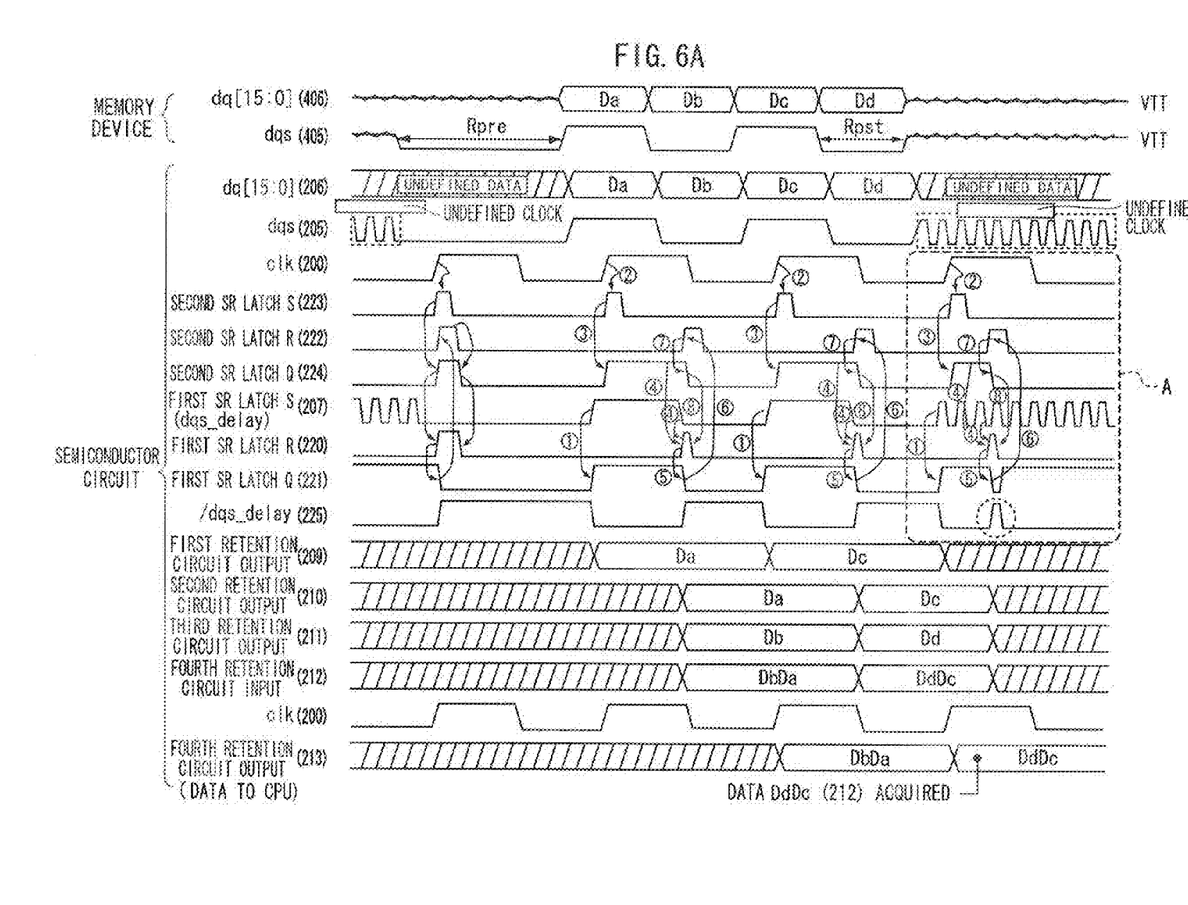
FIG. 6A is a timing chart illustrating operations incorporating the data strobe signal correction circuit.
Figure 6B:
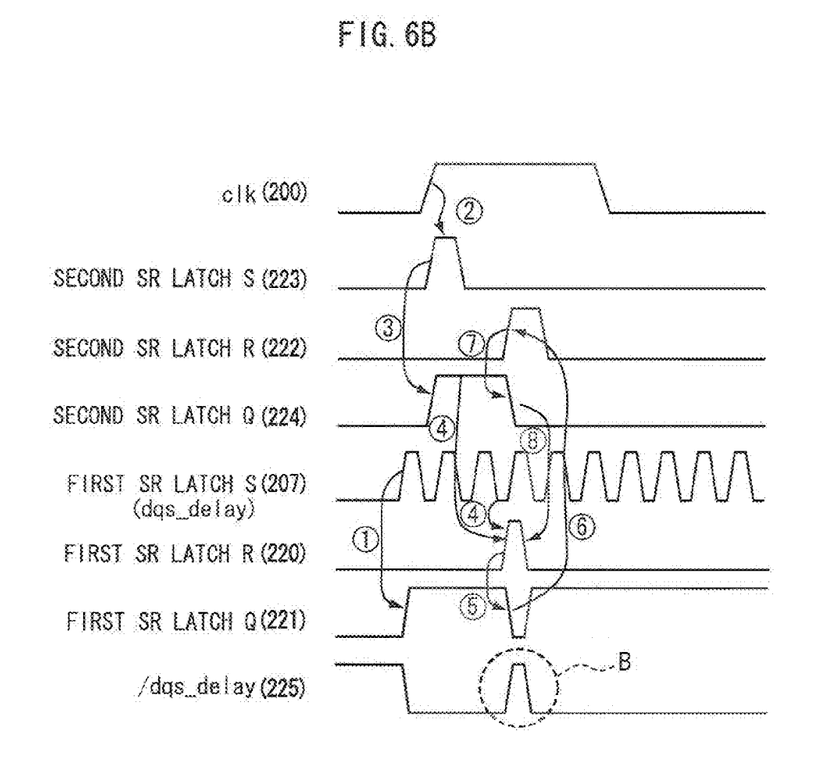
FIG. 6B is a timing chart showing a magnified portion of the timing chart shown in FIG. 6A.

FIG. 6A and FIG. 6B illustrate operations incorporating the data strobe signal correction circuit 700 in detail in the form of timing charts. Here, the Read data 213 is transmitted to the CPU after the 16-bit data signal dq[15:0] 406 and the data strobe signal dqs 405 are outputted from the memory device 400. A region A of FIG. 6A is shown magnified in FIG. 6B.

Herebelow, with reference to FIG. 6B, operations responding to changes in signal waveforms at the respective sections are described hereafter with reference to numbers 1 to 8, which show sequential relationships (the numbers enclosed in circles in FIG. 6A and FIG. 6B).

In the operation at number 1, the data strobe signal dqs_delay 207 that has been delayed by the delay circuit 102 goes to High, and thus the S terminal of the first SR latch 120 goes to High. Thus, the output 221 of the first SR latch 120 changes from Low to High.

In the operation at number 2, the rising edge detection circuit 124 detects a rising edge of the normal phase clock clk 200, generates a High pulse signal 223, and inputs the same to the S terminal of the second SR latch 121.

In the operation at number 3, because the S terminal of the second SR latch 121 goes to High, the output 224 of the second SR latch 121 goes to High.

In the operation at number 4, when the data strobe signal dqs_delay 207 that has been delayed by the delay circuit 102 goes to Low while the output 224 of the second SR latch 121 is High, the output 220 of the AND circuit 122 goes to High. Thus, a High signal is inputted to the R terminal of the first SR latch 120.

In the operation at number 5, when the R terminal of the first SR latch 120 goes to High, the output 221 of the first SR latch 120 changes from High to Low.

In the operation at number 6, the falling edge detection circuit 123 detects the falling edge of the output 221 of the first SR latch 120, generates a High pulse signal 222, and inputs the same to the R terminal of the second SR latch 121.

In the operation at number 7, when the R terminal of the second SR latch 121 goes to, High, the output 224 of the second SR latch 121 goes to Low.

In the operation at number 8, when the output 224 of the second SR latch 121 goes to Low, the output 220 of the AND circuit 122 goes to Low, and the R terminal of the first SR latch 120 goes to Low.

Thereafter, the operations from number 1 to number 8 are repeated, and /dqs_delay 225 is generated, which is used as a clock signal of the second retention circuit 104 and the third retention circuit 105. The 16-bit Read data signal dq[15:0] 255 from the memory device 400 is transmitted to the CPU as the Read data 213 by operations the same as the operations illustrated in FIG. 3 and FIG. 4.

By the operations of the data strobe signal correction circuit described above, the rising edge of the /dqs_delay 225 may be delayed until the rising edge detection pulse signal 223 of the normal phase clock clk 200 goes to High (the area encircled by the circular broken line B in FIG. 6A and FIG. 6B). Therefore, the rising edge of the /dqs_delay 225 does not occur until the 32-bit data signal 212 has been acquired at the fourth retention circuit 106. Therefore, at the fourth retention circuit 106, an undefined clock causing updating of the 32-bit data signal 212 to undefined data before the 32-bit data signal 212 is acquired in accordance with the normal phase clock clk 200 is avoided. Thus, the correct 32-bit data signal 212 is acquired by the fourth retention circuit 106.

As is clear from the exemplary embodiment described above, a constitution is provided, based on the memory control circuit according to the present disclosure, that delays a rising edge of a data strobe signal, by performing masking processing of the data strobe signal being in an undefined state, until a pulse signal detecting a rising edge of a clock signal that provides a timing of data acquisition is effective. Therefore, data signals that are outputted from the memory device may be correctly transmitted to a CPU as Read data without being affected by a delay time due to wiring between the memory control circuit and a memory device, a shift in delay time due to finishing irregularities in wafer processing, or the like.

Furthermore, with the constitution of the present disclosure, a delay circuit that applies a delay to the data strobe signal may be provided in addition to the data strobe signal correction circuit. With this constitution, delay correction may be applied to biasing delays in combination with delay correction of irregularities in fabrication processing.

The exemplary embodiment described above has been described with the memory device being a DDR-SDRAM, but the present disclosure is not to be limited thus. The memory device in the present disclosure may be any of various memory devices of types that transfer data between a memory control circuit and the memory device in accordance with a data strobe signal.

Following from the above description, it should be apparent to those of ordinary skill in the art that, while the methods and apparatuses herein described constitute exemplary embodiments of the present disclosure and that changes may be made to such embodiments without departing from the scope of the invention as defined by the claims. Additionally, it is to be understood that the invention is defined by the claims and it is not intended that any limitations or elements describing the exemplary embodiments set forth herein are to be incorporated into the interpretation of any claim element unless such limitation or element is explicitly stated. Likewise, it is to be understood that it is not necessary to meet any or all of the identified advantages or objects of the disclosure in order to fall within the scope of any claims, since the invention is defined by the claims and since inherent and/or unforeseen advantages of the present invention may exist even though they may not have been explicitly discussed herein.

What is claimed is:

1. A memory control circuit comprising:
   a clock generation circuit that generates a clock signal and provides the clock signal to an external memory device;
   at least one retention circuit that retains a data signal provided from the external memory device only under a significant state of a data strobe signal, which is provided together with the data signal;
   a data acquisition timing judgment unit that, by monitoring the clock signal, judges whether or not a timing of the data acquisition has arrived; and
   a data strobe signal correction unit that maintains the significant state of the data strobe signal until it is judged that the data acquisition timing has arrived;
   wherein the memory control circuit controls data acquisition from the retention circuit in accordance with the clock signal.

2. The memory control circuit according to claim 1, wherein the data strobe signal correction unit maintains the significant state of the data strobe signal by performing masking processing of the data strobe signal provided from the external memory device going from the significant state to an undefined state.

3. The memory control circuit according to claim 1, further comprising a delay circuit that provides a prior delay to the data strobe signal that is provided to the data strobe signal correction unit.

4. The memory control circuit according to claim 1, wherein the data acquisition timing judgment unit and the data strobe signal correction unit comprise:
   a first SR latch circuit that retains an activated state of the data strobe signal;
   a falling edge detection circuit that detects a falling edge from the activated state of the data strobe signal retained at the first SR latch circuit and puts a first detection signal into an activated state;
   a rising edge detection circuit that detects a rising edge of the clock signal, which serves as the data acquisition timing, and puts a second detection signal into an activated state;
   a second SR latch circuit that retains the activated state of the second detection signal, and resets the retention of the activated state of the second detection signal in response to the activated state of the first detection signal; and
   an AND circuit that sets a third detection signal into an activated state in response to a non-activated state of the data strobe signal and the activated state retained by the second SR latch circuit,
   wherein the first SR latch circuit resets the retention of the activated state of the data strobe signal in response to the activated state of the third detection signal.

5. A semiconductor integrated circuit comprising a central processing unit, and a memory control circuit that controls an external memory device in accordance with control signals from the central processing unit, the memory control circuit including, for controlling data acquisition from a retention circuit in accordance with a clock signal:
   a clock generation circuit that generates the clock signal and provides the clock signal to the external memory device; and
   at least one of the retention circuit, which retains a data signal provided from the external memory device only under a significant state of a data strobe signal, which is provided together with the data signal, and the memory control circuit further including:

a data acquisition timing judgment unit that, by monitoring the clock signal, judges whether or not a timing of the data acquisition has arrived; and a data strobe signal correction unit that maintains the significant state of the data strobe signal until it is judged that the data acquisition timing has arrived.

6. The semiconductor integrated circuit according to claim 5, wherein the data strobe signal correction unit maintains the significant state of the data strobe signal by performing masking processing of the data strobe signal provided from the external memory device going from the significant state to an undefined state.

7. The semiconductor integrated circuit according to claim 5, further comprising a delay circuit that provides a prior delay to the data strobe signal that is provided to the data strobe signal correction unit.

8. The semiconductor integrated circuit according to claim 5, wherein the data acquisition timing judgment unit and data strobe signal correction unit comprise:

a first SR latch circuit that retains an activated state of the data strobe signal;

a falling edge detection circuit that detects a falling edge from the activated state of the data strobe signal retained at the first SR latch circuit and puts a first detection signal into an activated state;

a rising edge detection circuit that detects a rising edge of the clock signal, which serves as the data acquisition timing, and puts a second detection signal into an activated state;

a second SR latch circuit that retains the activated state of the second detection signal, and resets the retention of the activated state of the second detection signal in response to the activated state of the first detection signal; and an AND circuit that sets a third detection signal into an activated state in response to a non-activated state of the data strobe signal and the activated state retained by the second SR latch circuit, wherein the first SR latch circuit resets the retention of the activated state of the data strobe signal in response to the activated state of the third detection signal.

* * * * *